(12) United States Patent
Takamatsu et al.

(10) Patent No.: US 8,378,289 B2
(45) Date of Patent: Feb. 19, 2013

(54) OPTICAL RECEIVER MODULE AND MANUFACTURING METHOD WITH A SHIFTED AND ANGLED LIGHT RECEIVING ELEMENT

(75) Inventors: Hisashi Takamatsu, Yokohama (JP); Michihide Sasada, Yokosuka (JP)

(73) Assignee: Oclaro Japan, Inc., Yokohama-shi, Kanagawa (JP)

( * ) Notice: Subject to any disclaimer, the term of this patent is extended or adjusted under 35 U.S.C. 154(b) by 555 days.

(21) Appl. No.: 12/622,965

(22) Filed: Nov. 20, 2009

(65) Prior Publication Data
US 2010/0148041 A1    Jun. 17, 2010

(30) Foreign Application Priority Data
Dec. 11, 2008    (JP) .................. 2008-315422

(51) Int. Cl.
*G01J 1/04*    (2006.01)
*G01J 1/42*    (2006.01)
*G01J 5/08*    (2006.01)

(52) U.S. Cl. ............... 250/227.11; 250/227.2; 385/88
(58) Field of Classification Search ............ 250/227.11, 250/227.24, 227.2; 385/88–94
See application file for complete search history.

(56) References Cited

U.S. PATENT DOCUMENTS

| | | |
|---|---|---|
| 6,530,698 B1 | 3/2003 | Kuhara et al. |
| 2004/0067025 A1* | 4/2004 | Haraguchi et al. .............. 385/49 |

FOREIGN PATENT DOCUMENTS

| | | |
|---|---|---|
| JP | 05-152599 | 6/1993 |
| JP | 08-094887 | 4/1996 |
| JP | 08-186321 | 7/1996 |
| JP | 10-307236 A | 11/1998 |
| JP | 2001021775 A | 1/2001 |
| JP | 2003-209268 A | 7/2003 |
| JP | 2005-072130 A | 3/2005 |

OTHER PUBLICATIONS

Japanese Office action, and partial English translation thereof, issued in Japanese Patent Application No. JP 2008-315422 dated Jul. 3, 2012.

* cited by examiner

*Primary Examiner* — Francis M Legasse, Jr.
(74) *Attorney, Agent, or Firm* — McDermott Will & Emery LLP

(57) ABSTRACT

Provided is an optical receiver module capable of suppressing an increase, which is caused by tolerance of angle occurring at a time of manufacturing, in an amount of reflected return light that enters into an optical fiber while ensuring light-receiving efficiency. The light-receiving element (10) is arranged so that directions of the lines, which extend along the edges contained in a surface of the light-receiving element (10) on a side of the light-receiving-element support member (11), and which intersect with the region surrounded by a straight line corresponding to the incident direction of the light, a straight line corresponding to a direction of the optical axis of the optical fiber (3), and a supporting surface of the light-receiving-element support member (11) for supporting the light-receiving element (10), correspond to the directions different from the directions orthogonal to the incident direction of the light.

5 Claims, 7 Drawing Sheets

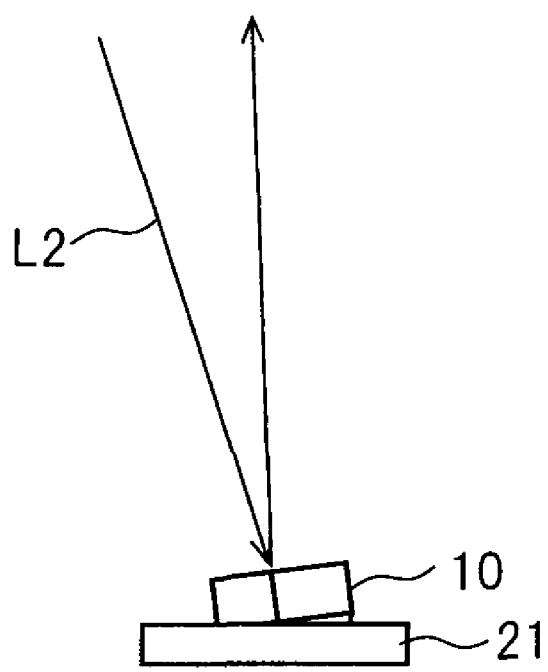

OPTICAL RECEIVER MODULE AND MANUFACTURING METHOD WITH A SHIFTED AND ANGLED LIGHT RECEIVING ELEMENT

CROSS-REFERENCE TO RELATED APPLICATION

The present application claims priority from Japanese application JP2008-315422 filed on Dec. 11, 2008, the content of which is hereby incorporated by reference into this application.

BACKGROUND OF THE INVENTION

1. Field of the Invention

The present invention relates to an optical receiver module and a manufacturing method for the optical receiver module.

2. Description of the Related Art

There is an optical receiver module for receiving light entered through an optical fiber connected thereto. Such optical receiver module generally includes a lens and a light-receiving element. Light entered through the optical fiber is entered into the light-receiving element via the lens, and the light-receiving element coverts an optical signal corresponding to the light into an electrical signal.

In the conventional optical receiver module, there is a case where the incident light entered into the light-receiving element is reflected by a light-receiving surface, and the reflected light is entered into the optical fiber. Such incident light entered into the optical fiber sometimes causes noise. Generally, in a high-speed and wide-bandwidth optical receiver module for performing high-speed transmission (several Gbits/s or more, for example) of signals, return loss of the light at an incident end is required to be reduced to a predetermined value or less. Specifically, for example, in ITU-T (international standard), the return loss of the light at the incident end is required to be −27 dB or less.

Therefore, conventionally, there has been taken various measures for reducing an amount of the reflected return light that enters into the optical fiber. For example, Japanese Patent Application Laid-open No. 08-186321 discloses a technology for reducing the amount of the reflected return light that enters into the optical fiber by causing a submount to be inclined with respect to an optical axis. Further, Japanese Patent Application Laid-open No. 08-094887, for example, discloses a technology for reducing the amount of the reflected return light that enters into the optical fiber by causing a surface of the submount on which the light-receiving element is mounted so as to be inclined with respect to the optical axis. Further, Japanese Patent Application Laid-open No. 05-152599, for example, discloses a technology for reducing the amount of the reflected return light that enters into the optical fiber by processing the light-receiving surface of the light-receiving element so as to be inclined with respect to the optical axis. Further, there also exists a technology for reducing the amount of the reflected return light that enters into the optical fiber by constituting the optical receiver module, with the optical fiber, the lens, and the light-receiving element being shifted from a central axis of the optical receiver module.

SUMMARY OF THE INVENTION

Even if the optical receiver module is designed so as to reduce the amount of the reflected return light that enters into the optical fiber in the above-mentioned manner, there is a fear in that, due to tolerance of angle which may be caused at the time of manufacturing, that is, at the time of assembling the light-receiving element or the submount on which the light-receiving element is mounted, such optical receiver module may be manufactured that the amount of the reflected return light that enters into the optical fiber is larger than the amount estimated at the time of designing. Therefore, in the above-mentioned design, there is a fear in that assembly yield is decreased. Meanwhile, as an angle of the incident direction of the light that enters into the light-receiving element with respect to the direction of the optical axis of the optical fiber becomes larger, the light that falls outside the light-receiving surface increases, which leads to a decrease in light-receiving efficiency.

The present invention has been made in view of the above-mentioned problems, and an object of the present invention is therefore to provide an optical receiver module capable of suppressing an increase, which is caused by tolerance of angle occurring at the time of manufacturing, in amount of reflected return light that enters into the optical fiber while ensuring the light-receiving efficiency, and to provide a manufacturing method for the optical receiver module.

In order to solve the above-mentioned problems, according to the present invention, there is provided an optical receiver module for receiving light which is entered through an optical fiber connected thereto. The optical receiver module includes: a light-receiving element; and a support member for supporting the light-receiving element, in which: the light-receiving element is arranged at a position shifted from a position on an optical axis of the optical fiber; and the light-receiving element is arranged so that directions of the lines, which extend along the edges contained in a surface of the light-receiving element on a side of the support member, and which intersect with the region surrounded by a straight line corresponding to the incident direction of the light, a straight line corresponding to a direction of the optical axis of the optical fiber, and a supporting surface of the support member for supporting the light-receiving element, correspond to the directions different from the directions orthogonal to the incident direction of the light.

Further, according to the present invention, there is provided a manufacturing method for an optical receiver module, which receives light entered through an optical fiber connected thereto, and includes a light-receiving element and a support member for supporting the light-receiving element. The manufacturing method includes: arranging the light-receiving element at a position shifted from a position on an optical axis of the optical fiber; and arranging the light-receiving element so that directions of the lines, which extend along the edges contained in a surface of the light-receiving element on a side of the support member, and which intersect with the region surrounded by a straight line corresponding to the incident direction of the light, a straight line corresponding to a direction of the optical axis of the optical fiber, and a supporting surface of the support member for supporting the light-receiving element, correspond to the directions different from the directions orthogonal to the incident direction of the light.

According to the present invention, when an angle of the incident light, which enters into the light-receiving element, with respect to the optical axis of the optical fiber is set to a value required for ensuring the light-receiving efficiency, the light enters obliquely with respect to the light-receiving surface of the light-receiving element so that the light is reflected with a higher possibility in a direction different from the incident direction, even if the tolerance of angle at the time of manufacturing occurs, in which the one edge of the light-receiving element being in contact with the support member serves as the axis. Therefore, such a fear that the reflected return light enters into the optical fiber is decreased. As a result, while ensuring the light-receiving efficiency, it is possible to suppress the increase in the amount of the reflected return light that enters into the optical fiber, which is caused by the tolerance of the angle occurring at the time of manufacturing.

In one aspect of the present invention, the light-receiving element is arranged so that directions of all the edges contained in the surface on the side of the support member of the light-receiving element correspond to the directions different from the direction orthogonal to the incident direction of the light. According to this aspect, even if the tolerance of angle at the time of manufacturing occurs, in which any one of the edges of the light-receiving element on the support member serves as the axis, the light enters obliquely with respect to the light-receiving surface of the light-receiving element, thereby making it possible to increase the possibility so that the light reflects in the direction different from the incident direction.

Further, in another aspect of the present invention, a light-receiving surface of the light-receiving element is inclined with respect to the supporting surface of the support member toward the optical axis of the optical fiber. According to this aspect, it is possible to increase the light-receiving efficiency.

Further, in still another aspect of the present invention, the direction along the edge contained in a surface of the light-receiving element on a side of the support member is defined on the basis of: the light-receiving efficiency; inclination of a light-receiving surface of the light-receiving element with respect to the supporting surface of the support member; and inclination of the incident direction of the light with respect to the direction of the optical axis of the optical fiber. According to this aspect, it is possible to set the direction along the edge contained in a surface of the light-receiving element on a side of the support member in view of the light-receiving efficiency.

BRIEF DESCRIPTION OF THE DRAWINGS

In the accompanying drawings:

FIG. 2C is a left-side view illustrating the one example of the details of the light-receiving element and the light-receiving-element support member according to the one embodiment;

DETAILED DESCRIPTION OF THE INVENTION

Hereinafter, embodiments of the present invention are described in detail with reference to the drawings.

Figure 1:
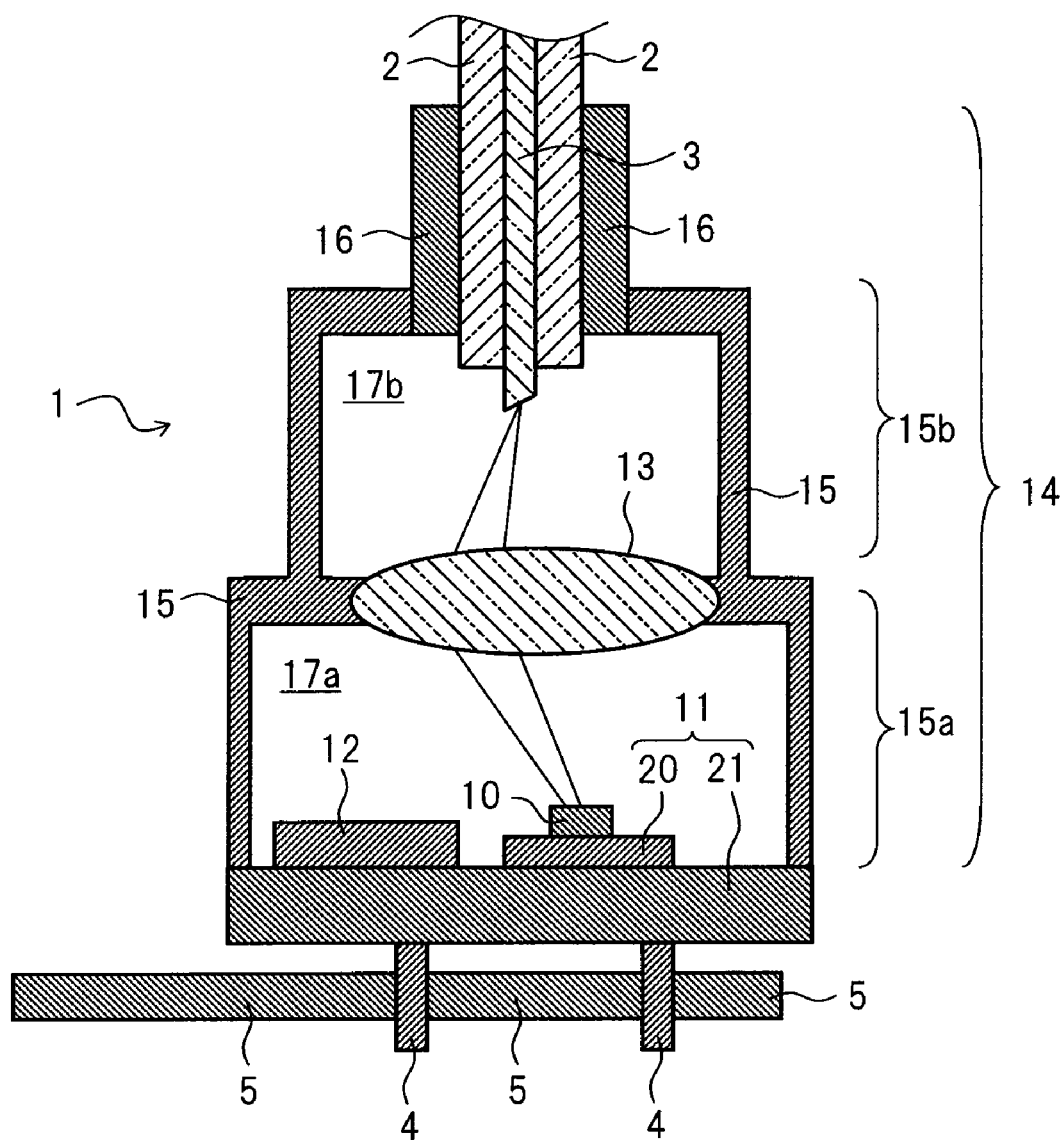
FIG. 1 is a schematic sectional view illustrating one example of a schematic structure of an optical receiver module according to one embodiment of the present invention.

FIG. 1 is a schematic sectional view illustrating one example of a schematic structure of an optical receiver module 1 according to one embodiment of the present invention. For example, as illustrated in FIG. 1, the optical receiver module 1 according to this embodiment includes a light-receiving element 10, a light-receiving-element support member 11, a mounted element 12 such as a preamplifier, a lens 13, and an optical receptacle 14.

In this embodiment, the optical receptacle 14 includes a lens-housing portion 15 and an optical-fiber-housing portion 16. The lens-housing portion 15 is a member integrally formed of metal, and includes a lower lens-housing portion 15a having a cylindrical outer shape, and an upper lens-housing portion 15b having a cylindrical outer shape whose outer diameter is smaller than that of the lower lens-housing portion 15a. Further, the lower lens-housing portion 15a and the upper lens-housing portion 15b are formed substantially concentrically.

In the lower lens-housing portion 15a, a cavity portion 17a having a circular cross-section is provided concentrically with the outer shape of the lower lens-housing portion 15a so as to constitute a bottomed cylindrical shape. Also in the upper lens-housing portion 15b, a cavity portion 17b having a circular cross-section is provided concentrically with the outer shape of the upper lens-housing portion 15b so as to constitute a bottomed cylindrical shape. Further, an end surface on a side of the cavity portion 17b of the upper lens-housing portion 15b and a base surface of the lower lens-housing portion 15a are connected to each other.

In the base surface of the lower lens-housing portion 15a, there is formed a hole whose center is at a position shifted from a central axis of the base surface of the lower lens-housing portion 15a. The lens 13 is fitted into the hole. In this manner, in the optical receiver module 1 according to this embodiment, the lens-housing portion 15 supports the lens 13.

In a base surface of the upper lens-housing portion 15b, a hole is provided concentrically with the central axis of the base surface of the upper lens-housing portion 15b. The optical-fiber-housing portion 16 is inserted into the hole. In this manner, in the optical receiver module 1 according to this embodiment, the optical-fiber-housing portion 16 and the lens-housing portion 15 are bonded together.

The optical-fiber-housing portion 16 is a cylindrical member made of metal. As illustrated in FIG. 1, into the opticalfiber-housing portion 16, an optical fiber 3 provided with a connector 2 is externally inserted.

The light-receiving-element support member 11 provided in the optical receiver module 1 according to this embodiment includes a submount 20 which is made of metal and has a square-plate-shape, and a stem 21 of a CAN-type, which is a disk-like member made of metal and having a diameter which is substantially the same as that of the outer shape of the lower lens-housing portion 15a of the optical receptacle 14.

Further, an end surface on a side of the cavity portion 17a of the lower lens-housing portion 15a and the stem 21 are bonded together. Further, on an inner surface of the stem 21, the submount 20 is mounted at the position shifted from the central axis of the stem 21. On the submount 20, there is mounted the light-receiving element 10 such as a photodiode, which receives light passing through the lens 13 and converts an optical signal corresponding to the light into an electrical signal. Further, on the inner surface of the stem 21, the mounted element 12 such as a preamplifier is also mounted.

The light-receiving element 10 and the mounted element 12 of the optical receiver module 1 according to this embodiment are electrically connected through an intermediation of lead pins 4 to a flexible substrate 5 provided outside the optical receiver module 1. The lead pins 4 are connected to the stem 21 from an outer surface of the stem 21. The electrical signal output from the light-receiving element 10 or the mounted element 12 is transmitted to the flexible substrate 5 via the lead pins 4.

Figure 2A:
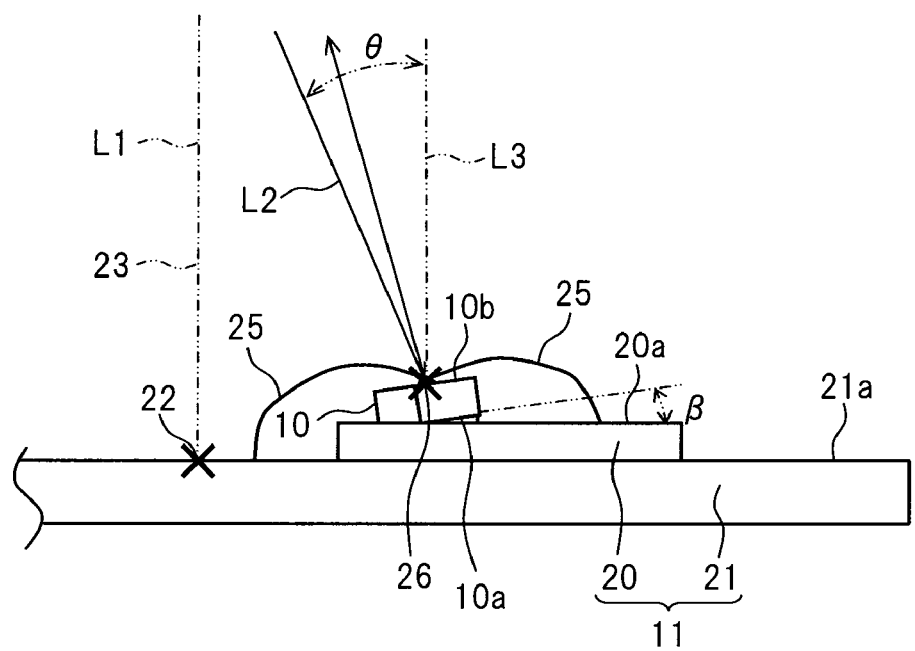
FIG. 2A is a front view illustrating one example of details of a light-receiving element and a light-receiving-element support member according to the one embodiment of the present invention.
Figure 2B:
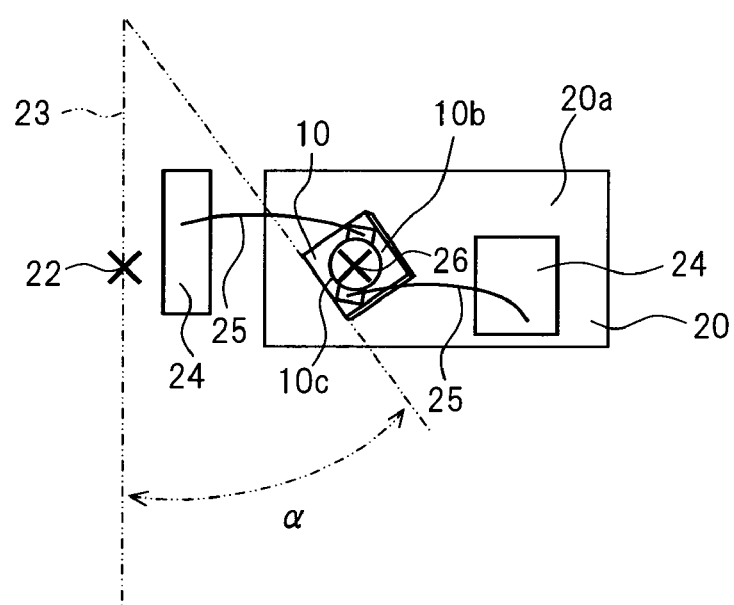
FIG. 2B is a plan view illustrating the one example of the details of the light-receiving element and the light-receiving-element support member according to the one embodiment.

FIG. 2A is a front view illustrating one example of details of the light-receiving element 10 and the light-receiving-element support member 11 (submount 20 and stem 21) provided in the optical receiver module 1 according to this embodiment. FIG. 2B is a plan view illustrating the one example of the details of the light-receiving element 10 and the light-receiving-element support member 11 provided in the optical receiver module 1 according to this embodiment. FIG. 2C is a left-side view illustrating the one example of the details of the light-receiving element 10 and the light-receiving-element support member 11 included in the optical receiver module 1 according to this embodiment.

Figure 3A:
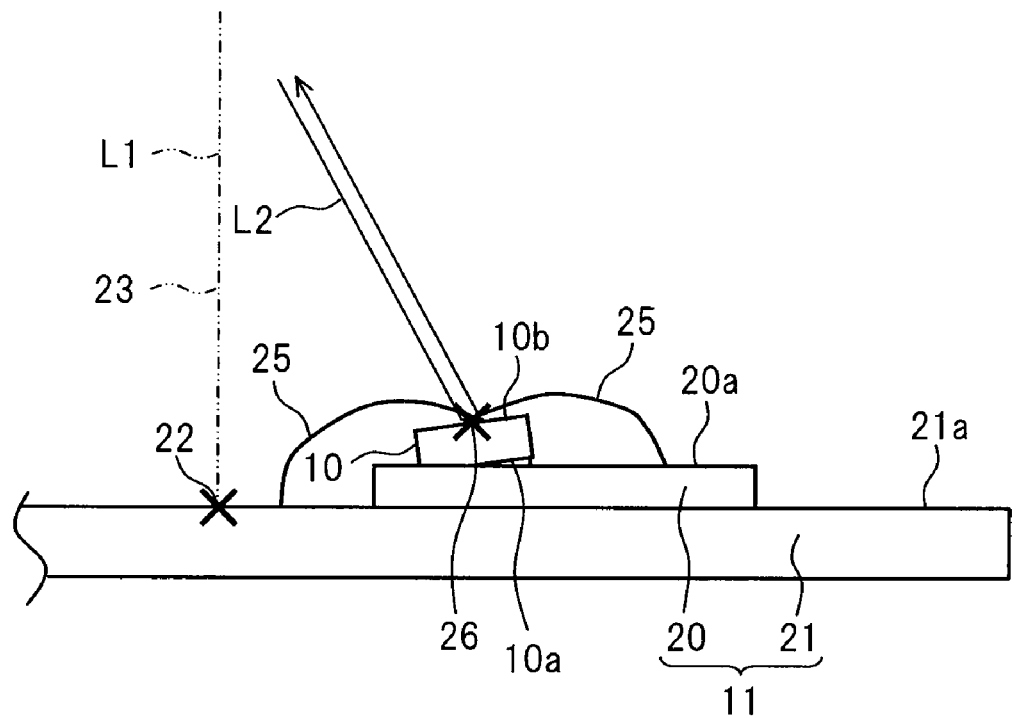
FIG. 3A is a front view illustrating details of a light-receiving element and a light-receiving-element support member according to a comparative example.
Figure 3B:
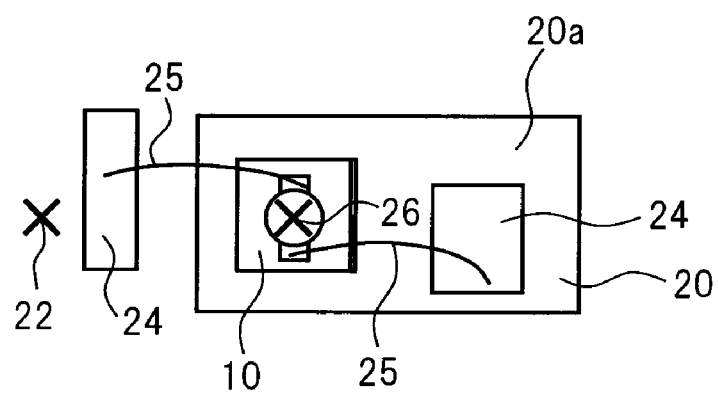
FIG. 3B is a plan view illustrating the details of the light-receiving element and the light-receiving-element support member according to the comparative example.
Figure 3C:
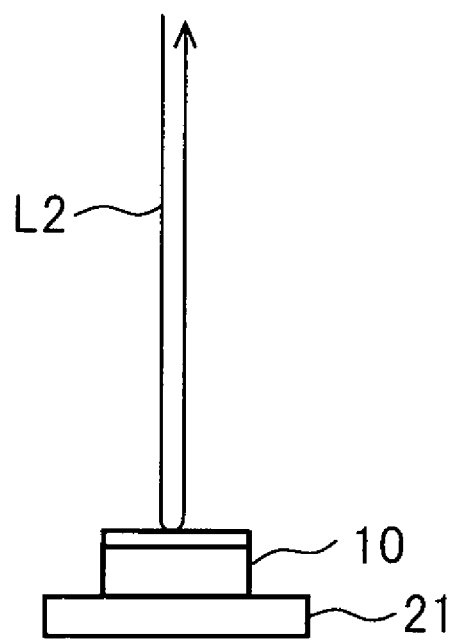
FIG. 3C is a left-side view illustrating the details of the light-receiving element and the light-receiving-element support member according to the comparative example.

FIG. 3A is a front view illustrating details of the light-receiving element 10 and the light-receiving-element support member 11 (submount 20 and stem 21) included in the optical receiver module 1 of a comparative example. FIG. 3B is a plan view illustrating the details of the light-receiving element 10 and the light-receiving-element support member 11 provided in the optical receiver module 1 of the comparative example. FIG. 3C is a left-side view illustrating the details of the light-receiving element 10 and the light-receiving-element support member 11 provided in the optical receiver module 1 of the comparative example.

In the optical receiver module 1 according to this embodiment, an inner surface of the submount 20 (light-receiving-element-supporting surface 20a for supporting the light-receiving element 10) and an inner surface of the stem 21 (submount-supporting surface 21a for supporting the submount 20) are substantially parallel to each other. Further, the light-receiving element 10 according to this embodiment has a square pole-shape. Further, the light-receiving element 10 is arranged at a position shifted from the position on an optical axis L1 of the optical fiber 3. Further, in this embodiment, directions of a plurality of edges contained in a surface on a side of the light-receiving-element support member 11 of the light-receiving element 10 (in this embodiment, the surface is, for example, a submount-side surface 10a) correspond to directions different from the direction orthogonal to an incident direction of light. More specifically, for example, regarding each of the plurality of edges contained in the submount-side surface 10a of the light-receiving element 10, a direction of a straight line obtained by projecting the each edge on the supporting surface of the light-receiving-element support member 11 (light-receiving-element-supporting surface 20a or submount-supporting surface 21a) corresponds to a direction different from a direction orthogonal to a straight line obtained by projecting the incident light on the supporting surface of the light-receiving-element support member 11 (light-receiving-element-supporting surface 20a or submount-supporting surface 21a).

Note that, in this embodiment, the submount-side surface 10a of the light-receiving element 10 has a square-shape (length of one edge is 0.4 mm or less, for example). Further, in this embodiment, the light-receiving surface 10b of the light-receiving element 10 is substantially parallel to the submount-side surface 10a.

Further, in this embodiment, regarding all of the four edges contained in the submount-side surface 10a of the light-receiving element 10, a value of an angle formed between each of the four edges and a plane (shift perpendicular plane surface 23) is not zero, the plane being perpendicular to a direction from an intersection point (optical-axis intersecting point 22) between the optical axis L1 of the optical fiber 3 and the light-receiving-element support member 11 (for example, stem 21) to the position at which the light-receiving element 10 is arranged. In this embodiment, for example, the position of the corner of the edges farthest from the optical axis L1 of the optical fiber 3 is set so that an angle formed between the edge of the four edges, which is nearest to the optical axis L1 of the optical fiber 3, and the shift perpendicular plane 23 becomes alpha (value of alpha is not zero).

Further, the light-receiving surface 10b of the light-receiving element 10 and a surface on the side of the light-receiving-element support member 11 (submount-side surface 10a) are inclined with respect to the inner surface of the stem 21 (or inner surface of the submount 20) toward the optical axis L1 of the optical fiber 3. In this embodiment, for example, an angle formed between the submount-side surface 10a of the light-receiving element 10 and the supporting surface of the submount 20 is set to be beta. Note that it is also possible that, by causing the submount 20 to be inclined with respect to the stem 21, the light-receiving surface 10b and the submount-side surface 10a of the light-receiving element 10 are inclined with respect to the inner surface of the stem 21.

The light-receiving surface 10b of the light-receiving element is provided with a light-receiving portion 10c, and the light-receiving portion 10c converts the optical signal entered through the lens 13 into the electrical signal. Further, the light-receiving element 10 is electrically connected by wires 25 to electrodes 24 provided on the stem 21, and the electrodes 24 and the lead pins 4 are electrically connected to each other.

In FIGS. 2A, 2C, 3A, and 3C, there is illustrated a light beam L2 corresponding to light which is entered into the light-receiving element 10 through the optical fiber 3 and the lens 13 and is reflected. Further, in the optical receiver module 1 according to this embodiment, an angle formed between the incident light entered into the light-receiving element 10 and the optical axis of the optical fiber 3 (angle formed between the incident light entered into the light-receiving element 10 and a direction L3 perpendicular to the supporting surface of the light-receiving-element support member 11) is set to be theta.

A manufacturing method for the optical receiver module 1 according this embodiment includes mounting the light-receiving element 10 on the submount 20, and mounting the submount 20 on the stem 21. Further, for bonding the light-receiving element 10 and the submount 20, and for bonding the submount 20 and the stem 21, solder, an adhesive, or the like is used.

In bonding using the solder or the adhesive, there is a fear that unevenness in coating of the solder or the adhesive (unevenness in thickness) occurs at the time of manufacturing of the optical receiver module 1. Further, there is a fear that unevenness of the solder or the adhesive causes erection tolerance of angle. Specifically, for example, the thickness of the solder or the adhesive is generally approximately 10 micrometers. It is desirable that the light-receiving element 10 be minimized as possible for such reasons that the light-receiving element 10 needs to have a size small enough to fall within the size of the supporting surface of the submount 20, and that the cost can be reduced. On the other hand, if the light-receiving element 10 is reduced in size, the tolerance of the angle due to unevenness of the solder or the adhesive becomes inconveniently larger. For example, when a length of one edge of the light-receiving element 10 is 0.2 mm and the thickness of the solder or the adhesive is 10 micrometers, the above-mentioned angle beta becomes approximately 3 degrees (approximately 0.05 radians). Generally, the thickness of the solder or the adhesive becomes larger than 10 micrometers in many cases. Further, the length of one edge of the light-receiving element 10 is shorter than 0.2 mm in other cases. Therefore, there is a possibility that the above-mentioned angle beta reaches 10 degrees.

Further, by pressing the light-receiving element 10 against the submount 20, the light-receiving element 10 and the submount 20 are bonded to each other by the solder or the adhesive. Therefore, it is highly possible that any one of the edges contained in the submount-side surface 10a of the light-receiving element 10 is brought into contact with submount 20. Further, at the time of pressing, tolerance of angle whose axis is the edge which is in contact with the submount 20 occurs in some cases.

At this time, for example, as in the optical receiver module 1 according to the comparative examples illustrated in FIGS. 3A, 3B, and 3C, when the submount-side surface 10a of the light-receiving element 10 contains the edge of the direction corresponding to the direction orthogonal to the incident direction of the light, there is a fear that, due to the above-mentioned tolerance of angle, the light-receiving element 10 is mounted on the submount 20 in a state where the light is perpendicularly entered into the light-receiving surface 10b of the light-receiving element 10, and the reflected return light is entered into the optical fiber 3.

In the optical receiver module 1 according to this embodiment, even if the above-mentioned tolerance of the angle occurs at the time of manufacturing, the light enters obliquely with respect to the light-receiving surface 10b of the light-receiving element 10, and is reflected in a direction different from the incident direction. Therefore, such fear that the reflected return light enters into the optical fiber 3 is reduced. In this manner, the return loss of the light is kept at a desirable amount.

As described above, in the optical receiver module 1 according to this embodiment, the directions of the edges contained in the surface of the light-receiving element 10, which are on the side of the light-receiving-element support member 11 (side of the submount 20, for example), correspond directions different from the direction orthogonal to the incident direction of the light. Therefore, compared with the optical receiver module 1 according to the comparative example illustrated in FIGS. 3A, 3B, and 3C, it is possible to suppress an increase in an amount of the reflected return light that enters into the optical fiber 3 due to the tolerance of the angle occurring at the time of manufacturing of the optical receiver module 1.

Further, in the optical receiver module 1 according to this embodiment, it is possible to suppress the increase in the amount of the reflected return light that enters into the optical fiber 3 due to occurrence of the tolerance of the angle at the time of manufacturing of the optical receiver module 1. Therefore, it is also possible to maintain the value of the above-mentioned angle theta to be small so as to ensure light-receiving efficiency.

In this case, description is made on one example of a method of calculating the value of the angle α based on the above-mentioned angle beta and the angle theta necessary for ensuring the light-receiving efficiency.

A value of inner product between a light beam vector r (0, sin(theta), cos(theta)) from the intersecting point (light-beam intersecting point 26) to the incident direction of the light, the intersecting point being formed between the light beam L2 which is entered into the light-receiving surface 10b of the light-receiving element 10 and the light-receiving surface 10b, and a perpendicular line vector n (sin(alpha)sin(beta), cos(alpha)sin(beta), cos(beta)) of light-receiving surface 10b is $\cos(\sin^{-1}(NA/2))$ or less. In this case, NA represents a spread angle (spread angle whose value is 1%) of the light beam collected in the light-receiving element 10. When the spread angle whose value is 1% is adopted as NA, the above-mentioned relationship becomes such a relationship that the return loss of the light becomes approximately −30 dB or less when the reflection rate on the surface of the light-receiving element 10 is set to be 2% which is a general value.

Based on the above-mentioned relationship, the relationship that the value of α is $\cos^{-1}((\cos(\sin^{-1}(NA/2))-\cos(theta)\cos(beta))/\sin(theta)\sin(beta))$ or less is derived. The value of alpha is physically at most 1.05 radians (approximately 60 degrees), and hence the following condition about the value of theta is derived based on the upper-limit value of alpha.

$$\theta \geq \tan^{-1}\frac{\tan\beta}{2} + \cos^{-1}\left[\sqrt{\frac{4}{1+3\cos^2\beta}}\cos\left(\sin^{-1}\frac{NA}{2}\right)\right]$$

As described above, the direction of the edge on the submount 20 side of the light-receiving element 10 may be a direction defined based on the light-receiving efficiency (for example, spread angle NA of the light beam collected in the light-receiving element 10), inclination of the light-receiving surface 10b of the light-receiving element 10 with respect to the supporting surface of the light-receiving-element support member 11, and inclination of the incident direction of the light with respect to the optical axis direction of the optical fiber 3.

Further, in the optical receiver module 1 according to this embodiment, the direction from the optical-axis intersecting point 22 to the position at which the light-receiving element 10 is arranged (shift direction) corresponds to the longitudinal direction of the submount 20. With this configuration, when the submount 20 and the stem 21 are bonded to each other by the solder or the adhesive, the tolerance of the angle of the submount 20 with respect to the stem 21 becomes likely to occur in the direction substantially perpendicular to the above-mentioned shift direction. At this time, by setting the length by which the submount 20 shifts from the optical-axis intersecting point 22 to be 0.7 mm or larger, the tolerance of the angle of the submount 20 with respect to the stem 21 falls within 1 degree even when unevenness in thickness of the solder or the adhesive is 10 micrometers.

Further, as the submount 20, there may be used a substrate which is made of insulating material and has an electrical pattern formed thereon, or an integrated circuit element.

Note that the present invention is not limited to the above-mentioned embodiment.

Figure 4A:
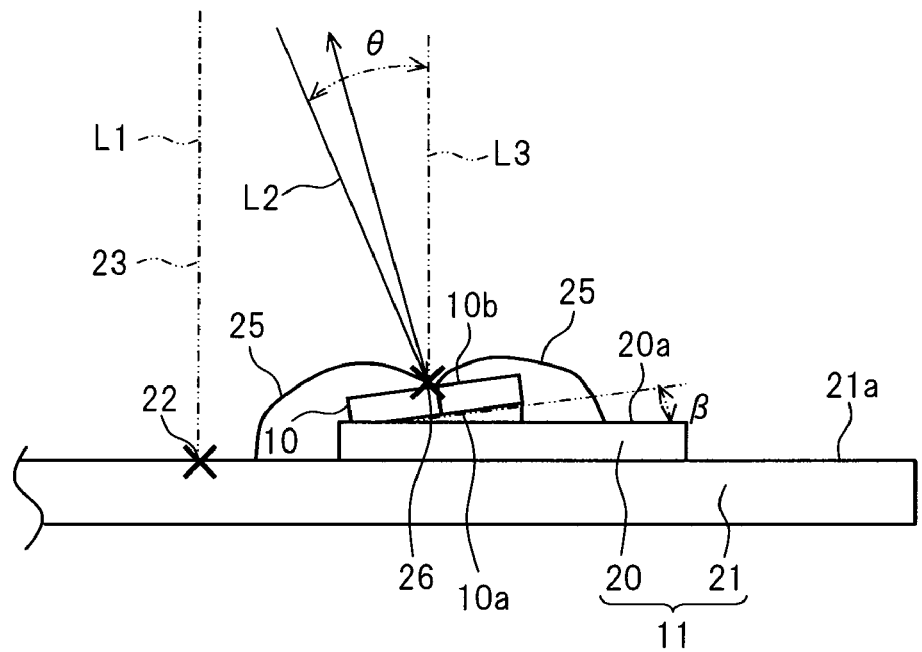
FIG. 4A is a front view illustrating one example of details of a light-receiving element and a light-receiving-element support member according to another embodiment of the present invention.
Figure 4B:
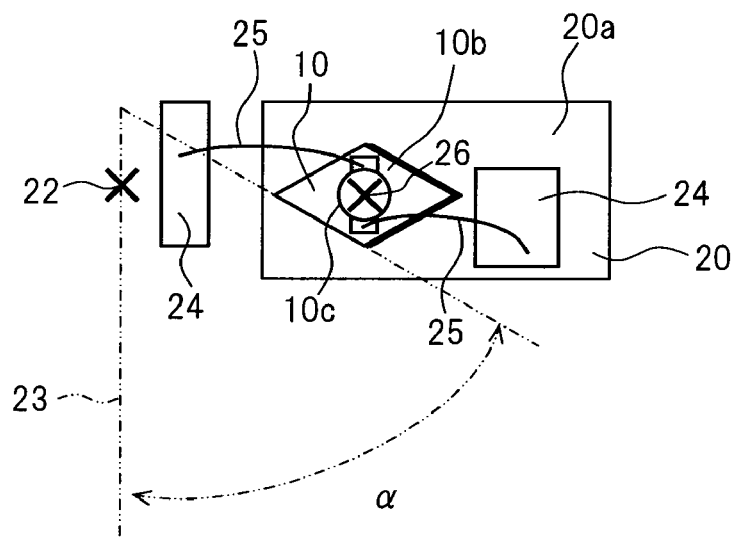
FIG. 4B is a plan view illustrating the one example of the details of the light-receiving element and the light-receiving-element support member according to the another embodiment of the present invention.

FIG. 4A is a front view illustrating details of the light-receiving element 10 and the light-receiving-element support member 11 (submount 20 and stem 21) provided in the optical receiver module 1 according to another embodiment of the present invention. FIG. 4B is a plan view illustrating the details of the light-receiving element 10 and the light-receiving-element support member 11 provided in the optical receiver module 1 according to the embodiment illustrated in FIG. 4A. In FIG. 4A, the light beam L2 is illustrated.

For example, as illustrated in FIGS. 4A and 4B, the surface on the side of the light-receiving-element support member 11 of the light-receiving element 10 (in this embodiment, submount-side surface 10a) may be a rhomboid-shape. Specifically, for example, the light-receiving element 10 may be formed into a rhomboid columnar-shape. Further, directions of diagonal lines on the surface on the side of the light-receiving-element support member 11 of the light-receiving element 10 (in this embodiment, submount-side surface 10a) may correspond to the direction of a straight line passing a point on the optical axis of the optical fiber 3. More specifically, for example, extending directions of the diagonal lines on the surface on the side of the light-receiving-element support member 11 of the light-receiving element 10 may intersect the direction of the optical axis of the optical fiber 3. With this configuration, compared with the case in which the light-receiving element 10 has a rectangular parallelepiped-shape, the range of the value of the above-mentioned angle alpha is widened. Therefore, it is possible to further suppress the increase in the amount of the reflected return light that enters into the optical fiber 3 due to the occurrence of the tolerance of the angle at the time of manufacturing of the optical receiver module 1.

Figure 5A:
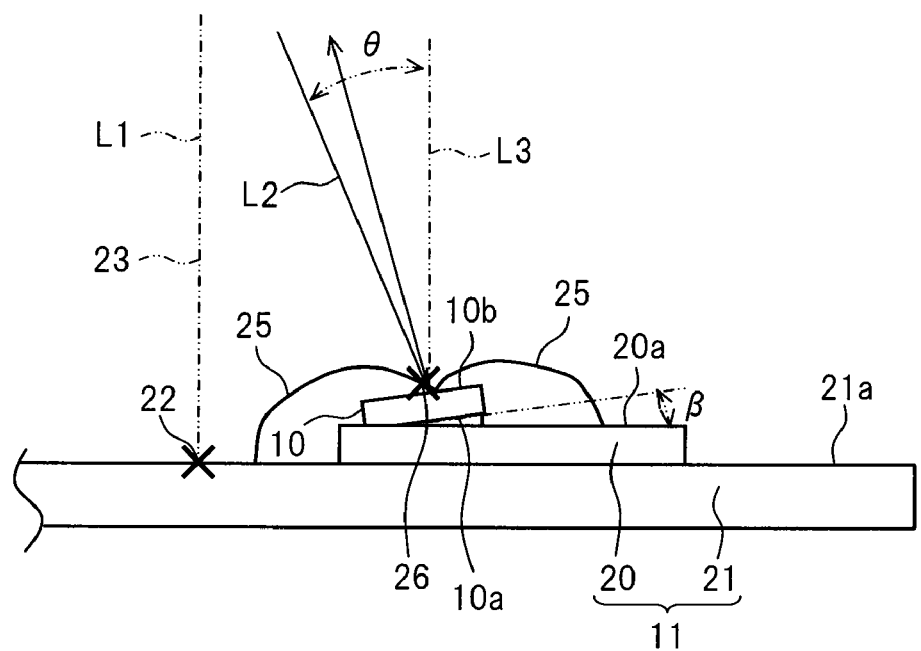
FIG. 5A is a front view illustrating the one example of the details of a light-receiving element and a light-receiving-element support member according to still another embodiment of the present invention.
Figure 5B:
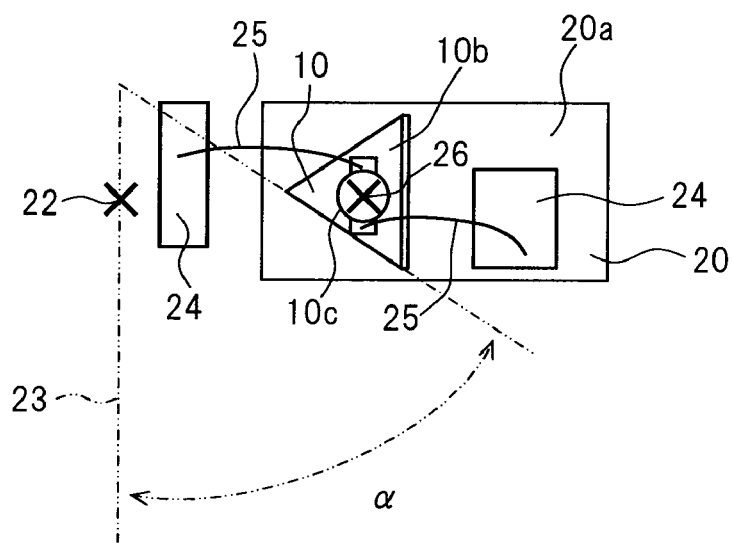
FIG. 5B is a plan view illustrating the one example of the details of the light-receiving element and the light-receiving-element support member according to the still another embodiment of the present invention.

FIG. 5A is a front view illustrating details of the light-receiving element 10 and the light-receiving-element support member 11 (submount 20 and stem 21) provided in the optical receiver module 1 according to still another embodiment of the present invention. FIG. 5B is a plan view illustrating the details of the light-receiving element 10 and the light-receiving-element support member 11 provided in the optical receiver module 1 according to the embodiment illustrated in FIG. 5B. In FIG. 5A, the light beam L2 is illustrated.

As illustrated in FIGS. 5A and 5B, the surface on the side of the light-receiving-element support member 11 of the light-receiving element 10 (in this embodiment, submount-side surface 10a) may be a triangle-shape. Specifically, for example, the light-receiving element 10 may be formed into a triangle-pole-shape. With this configuration, compared with the case in which the light-receiving element 10 has a square-pole-shape, the range of the value of the above-mentioned angle alpha is widened. Therefore, it is possible to further suppress the increase in the amount of the reflected return light that enters into the optical fiber 3 due to the occurrence of the tolerance of the angle at the time of manufacturing.

Further, as is apparent from FIGS. 5A and 5B, it is unnecessary that directions of all edges contained in the surface on the side of the light-receiving-element support member 11 of the light-receiving 10 correspond to the directions different from the direction orthogonal to the incident direction of the light. Specifically, it is sufficient that the directions of the lines, which extend along the edges contained in a surface of the light-receiving element 10 on a side of the light-receiving-element support member 11, and which intersect with the region surrounded by a straight line corresponding to the incident direction of the light, a straight line corresponding to a direction of the optical axis of the optical fiber 3, and a supporting surface of the light-receiving-element support member 11 for supporting the light-receiving element 10, correspond to the directions different from the directions orthogonal to the incident direction of the light.

Note that, the present invention is not limited even to the above-mentioned embodiments.

For example, the light-receiving element 10 provided in the optical receiver module 1 according to each of the embodiments may not be inclined with respect to the supporting surface of the light-receiving-element support member 11. Further, the inner surface of the stem 21 and the inner surface of the submount 20 (supporting surface for supporting the light-receiving element 10) may not be substantially parallel to each other. Further, the light-receiving surface 10b of the light-receiving element 10 and the submount-side surface 10a may not be substantially parallel to each other. Further, a shape of the light-receiving surface 10b of the light-receiving element 10 and a shape of the submount-side surface 10a may be different from each other.

While there have been described what are at present considered to be certain embodiments of the invention, it will be understood that various modifications may be made thereto, and it is intended that the appended claims coverall such modifications as fall within the true spirit and scope of the invention.

What is claimed is:

1. An optical receiver module for receiving light which is entered through an optical fiber connected thereto, comprising:
  a light-receiving element; and
  a support member for supporting the light-receiving element, wherein:
  the light-receiving element is arranged at a position shifted from a position on an optical axis of the optical fiber; and
  the light-receiving element is arranged such that:
    a shift perpendicular plane, which is a plane including an intersecting point between the optical axis of the optical fiber and a surface of the support member on a side facing the light-receiving element, is perpendicular to said surface,
    the shift perpendicular plane is perpendicular to a line intersecting with the optical axis of the optical fiber, said line being from a light-beam intersecting point, which is an intersecting point between the entered light and a light-receiving surface of the light-receiving element, and
    the shift perpendicular plane is not parallel to a direction of a nearest edge of the light-receiving element, the nearest edge being contained in the surface of the support member on the side facing the light-receiving-element and being nearest, among all edges of the light-receiving element, to the intersecting point between the optical axis of the optical fiber and the surface of the support member on the side facing the light-receiving element.

2. The optical receiver module according to claim 1, wherein the light-receiving element is arranged so that directions of all edges contained in a surface of the light-receiving element on a side of the support member are not parallel to the shift perpendicular plane.

3. The optical receiver module according to claim 1, wherein the light-receiving surface of the light-receiving element is inclined with respect to the supporting surface of the support member toward the optical axis of the optical fiber.

4. The optical receiver module according to claim 1, wherein the direction of the nearest edge is defined on the basis of:
  light-receiving efficiency;
  inclination of the light-receiving surface of the light-receiving element with respect to the supporting surface of the support member; and
  inclination of an incident direction of the light with respect to the direction of the optical axis of the optical fiber.

5. A manufacturing method for an optical receiver module, which receives light entered through an optical fiber connected thereto and comprises a light-receiving element and a support member for supporting the light-receiving element, the manufacturing method comprising:
  arranging the light-receiving element at a position shifted from a position on an optical axis of the optical fiber; and
  arranging the light-receiving element such that:
    a shift perpendicular plane, which is a plane including an intersecting point between the optical axis of the optical fiber and a surface of the support member on a side facing the light-receiving element, is perpendicular to said surface,
    the shift perpendicular plane is perpendicular a line intersecting with the optical axis of the optical fiber, said line being from a light-beam intersecting point, which is an intersecting point between the entered light and a light-receiving surface of the light-receiving element, and
    the shift perpendicular plane is not parallel to a direction of a nearest edge of the light-receiving element, the nearest edge being contained in the surface of the support member on the side facing the light-receiving-element and being nearest, among all edges of the light-receiving element, to the intersecting point between the optical axis of the optical fiber and the surface of the support member on the side facing the light-receiving element.

* * * * *